(12) United States Patent
Ho et al.

(10) Patent No.: US 9,716,249 B2
(45) Date of Patent: Jul. 25, 2017

(54) DISPLAY MODULE ENCAPSULATING STRUCTURE AND PREPARING METHOD THEREOF

(71) Applicant: EverDisplay Optronics (Shanghai) Limited, Shanghai (CN)

(72) Inventors: Hsinju Ho, Shanghai (CN); Chienlin Wu, Shanghai (CN); Huan Jiang, Shanghai (CN)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 15/143,835

(22) Filed: May 2, 2016

(65) Prior Publication Data

US 2016/0322600 A1  Nov. 3, 2016

Related U.S. Application Data

(60) Provisional application No. 62/154,866, filed on Apr. 30, 2015.

(51) Int. Cl.
*H01L 27/14* (2006.01)
*H01L 51/52* (2006.01)
(Continued)

(52) U.S. Cl.
CPC ........ *H01L 51/5256* (2013.01); *H01L 27/323* (2013.01); *H01L 27/3244* (2013.01); *H01L 27/3246* (2013.01); *H01L 27/3262* (2013.01); *H01L 27/3281* (2013.01); *H01L 29/78672* (2013.01); *H01L 51/004* (2013.01); *H01L 51/0035* (2013.01); *H01L 51/0096* (2013.01); *H01L 51/524* (2013.01);
(Continued)

(58) Field of Classification Search
CPC ......... H01L 21/31; H01L 21/48; H01L 21/56; H01L 23/28
USPC ................................ 257/40, 59, 72, E39.007
See application file for complete search history.

(56) References Cited

U.S. PATENT DOCUMENTS

| 8,841,840 B2* | 9/2014 | Jung | .................... H01L 51/5253 313/512 |
| 2011/0163330 A1* | 7/2011 | Kim | ..................... H01L 51/5256 257/88 |

(Continued)

*Primary Examiner* — Tan N Tran
(74) *Attorney, Agent, or Firm* — Andrew F. Young, Esq.; Lackenbach Siegel, LLP (57) ABSTRACT

A display module encapsulating structure and preparation method thereof, which relates to the field of display devices and can be applied to preparing AMOLED and other related display devices as described in the application, mainly use the thin film encapsulation structure to hermetically protect the display module (such as OLED display module), that is sealing the display module by inorganic thin film layer having the characteristics of transparency as well as containing moisture-resistance and oxygen-resistance; buffering the internal and external stresses of the thin film layers and restraining the falling off of the layers caused by the bending stress when preparing flexible devices. Meanwhile, the raised features formed by multilayer stack can effectively inhibit the diffusion effect of inorganic coating and increase the number of side water retaining walls of thin film device, therefore, effectively improve the encapsulating effect.

21 Claims, 3 Drawing Sheets

(51) Int. Cl.
*H01L 27/32* (2006.01)
*H01L 51/56* (2006.01)
*H01L 29/786* (2006.01)
*H01L 51/00* (2006.01)

(52) U.S. Cl.
CPC ...... *H01L 51/5237* (2013.01); *H01L 51/5253* (2013.01); *H01L 51/5262* (2013.01); *H01L 51/56* (2013.01); H01L 51/0034 (2013.01); H01L 2227/323 (2013.01); H01L 2251/301 (2013.01); H01L 2251/303 (2013.01); H01L 2251/558 (2013.01)

(56) References Cited

U.S. PATENT DOCUMENTS

2012/0319123 A1* 12/2012 Han .................. H01L 51/5246
257/72
2013/0207093 A1    8/2013 Jeong et al.

* cited by examiner

DISPLAY MODULE ENCAPSULATING STRUCTURE AND PREPARING METHOD THEREOF

CROSS-REFERENCE TO RELATED APPLICATIONS

The present application claims priority to and the benefit of U.S. Provisional Application No. 62/154,866, filed on Apr. 30, 2015, the entire content of which are incorporated herein by reference.

BACKGROUND OF THE INVENTION

1. Field of the Invention

The invention relates to the field of display devices, and more specifically, to a display module encapsulating structure and the preparation method thereof.

2. Description of the Related Art

Among display devices of an electronic device, electronic devices, such as a light emitting diode (LED) or an organic light emitting diode (OLED), which is used for generating light source, are the key devices for the normal operation of a display device. However, the electronic devices mentioned above are extremely vulnerable to the erosion of moisture and oxygen in the external environment. Therefore, the electronic devices should be protected in isolation in order to ensure the normal operation of electronic devices.

Figure 1:
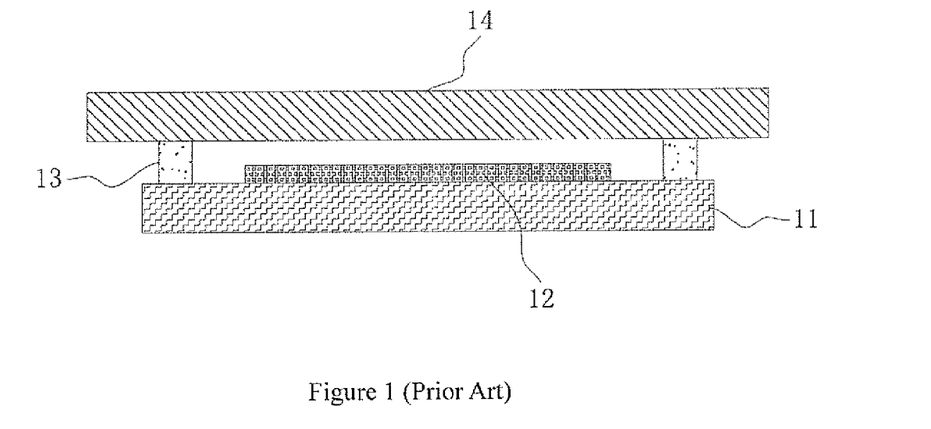
FIG. 1 shows a normal display module encapsulating structure.

At present, we mainly use glass glue to fix the cover plate onto the array substrate so as to seal display electronic devices disposed on the array substrate; as shown in FIG. 1, in traditional display module encapsulating structure, the array substrate 11 is provided with the display module 12 which is sealed by means of using glass glue 13 to fix the cover plate 14 onto the array substrate 11.

However, the mechanical strength of the encapsulating structure as shown in FIG. 1 is weak because of the characteristics of the glass glue 13 itself and the gap between the cover glass 14 and the array substrate 11. Therefore, the encapsulating structure is extremely likely to be damaged when an external force is encountered. Especially, in the service lifetime test, the encapsulating structure is extremely likely to generate the gap which cause the penetration of the destructive gas in the external environment into the sealing structure, leading to the erosion of the display module 12 mentioned above and even the damage to the display module 12 when encountering an external force. Therefore, the display device can not work properly.

Aspects and Summary of the Invention

To solve the above technical problems, the application provides a display module encapsulated structure, comprising:

an array substrate, the surface of which is provided with a display module;

raised structures, disposed on a surface of the array substrate and placed in periphery of the display module;

a first film layer, covering the display module as well as a surface of the array substrate located between the display module and the raised structures to seal the display module;

a second film layer, covering the first film layer as well as parts of surfaces of the raised structures;

a third film layer, covering the second film layer, the raised structures and the parts of the surface of the array substrate;

a fourth film layer, covering parts of a surface of the third film layer, and a fifth film layer, covering parts of surfaces of the fourth film layer and third film layer to seal the fourth film layer onto the third film layer.

As a preferable embodiment of the above display module encapsulating structure, wherein the array substrate is further provided with a thin film transistor display circuit connected to the display module to drive the display module.

As a preferable embodiment of the above display module encapsulating structure, wherein, the array substrate is a low temperature polysilicon substrate.

As a preferable embodiment of the above display module encapsulating structure, wherein the display module has a light emitting surface for light emission and a backlight surface opposite to the light emitting surface; and the backlight surface of the display module is adhered onto the surface of the array substrate; the first film layer covers the light emitting surface of the display module.

As a preferable embodiment of the above display module encapsulating structure, wherein, the display module is an OLED display module.

As a preferable embodiment of the above display module encapsulating structure, wherein, the raised structures are stack structures with multilayer films.

As a preferable embodiment of the above display module encapsulating structure, wherein, the raised structures are made of heterocyclic polymers containing imino group and benzene ring.

As a preferable embodiment of the above display module encapsulating structure, wherein, a thickness of the raised structures is larger than sum of thicknesses of the first film layer and second film layer.

As a preferable embodiment of the above display module encapsulating structure, wherein, the first film layer, the third film layer and the fifth film layer are all made of inorganic materials; and the second film layer and the third film layer are both made of organic materials.

As a preferable embodiment of the above display module encapsulating structure, wherein, the first film layer is made of metal oxide or silicon nitride, both of which are transparent, moisture-resistant, and oxygen-resistant.

As a preferable embodiment of the above display module encapsulating structure, wherein, the second film layer and the fourth film layer are made of acrylic resin compound having characteristics of buffering and transparency.

As a preferable embodiment of the above display module encapsulating structure, wherein, the third film layer and the fifth film layer are made of silicon nitride.

The applicant also provides a method for preparing display module encapsulating structure, comprising:

forming an array substrate with a surface provided with a display module after a process for forming array; the array substrate in the periphery of the display module being formed with raised structures;

preparing a first film layer to cover the display module as well as a surface of the array substrate located between the display module and the raised structures to seal the display module;

forming a second film layer onto an exposed surface of the first film layer; the second film layer covering parts of surfaces of the raised structures;

preparing a third film layer to cover parts of the second film layer, the raised structures and the array substrate;

preparing a fourth film layer onto the third film layer;

preparing the fifth film layer covering parts of surfaces of the fourth film layer and the third film layer to seal the fourth film layer onto the third film layer.

As a preferable embodiment of the above method, further comprising:

preparing on the array substrate a thin film transistor display circuit connecting the display module to drive the display module.

As a preferable embodiment of the above method, wherein, the array substrate is a low temperature polysilicon substrate.

As a preferable embodiment of the above method, wherein, the display module has a light emitting surface for light emission and a backlight surface opposite to the light emitting surface; and the backlight surface of the display module is adhered onto the surface of the array substrate; the first film layer is formed onto the light emitting surface of the display module.

As a preferable embodiment of the above method, wherein, the display module is an OLED display module.

As a preferable embodiment of the above method, wherein, the raised structures are formed by stacking multilayer thin films.

As a preferable embodiment of the above method, wherein, the raised structures are made of heterocyclic polymers containing imino group and benzene ring.

As a preferable embodiment of the above method, wherein, a thickness of the raised structures is larger than sum of thicknesses of the first film layer and second film layer.

As a preferable embodiment of the above method, wherein forming the first film layer, the third film layer and the fifth film layer by inorganic materials; and forming the second film layer and the third film layer by organic materials.

As a preferable embodiment of the above method, wherein, atomic layer deposition is employed to deposit metal oxide or silicon nitride, both of which are transparent, moisture-resistant, and oxygen-resistant to prepare the first film layer.

As a preferable embodiment of the above method, wherein, em ink jet printing is employed to spray acrylic resin compound having characteristics of buffering and transparency to prepare the second film layer and the fourth film layer.

As a preferable embodiment of the above method, wherein, atomic layer deposition, chemical vapor deposition, or plasma enhanced chemical vapor deposition is employed to deposit silicon nitride to prepare the third film layer and the fifth film layer.

The above technical schemes have the following advantages or beneficial effects:

The display module encapsulating structure and preparation method thereof, applied in preparing AMOLED and other related display devices, mainly use a thin film encapsulation structure to hermetically protect the display module, such as OLED display module, that is sealing the display module by inorganic thin film layer which is transparent, moisture-resistant, and oxygen-resistant, buffering the internal and external stresses to the thin film layer by preparing organic films outside the inorganic thin film layer and restraining the layer from falling off caused by the bending stress in preparation of flexible devices. Further, the raised structures stacked by multilayer films can effectively restrain the diffusion effect of coating on inorganic films and can increase the number of side retaining walls for resisting moisture in thin film device, and thus effectively improves the encapsulating in effect. The raised structures formed by multilayer stack can also be used to support metal masks to prevent the substrate surface pattern from being damaged during the coating process. Moreover, compared with the Frit packaging, the thin film packaging can effectively improve the mechanical strength of the whole display device.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The display module encapsulating structure and preparation method thereof, applied in preparing AMOLED and other related display devices, mainly use a thin film encapsulation structure to hermetically protect the display module, such as OLED display module, that is sealing the display module by inorganic thin film layer which is transparent, moisture-resistant, and oxygen-resistant, buffering the internal and external stresses to the thin film layer by preparing organic films outside the inorganic thin film layer and restraining the layer from falling off caused by the bending stress in preparation of flexible devices. Further, the raised structures stacked by multilayer films can effectively restrain the diffusion effect of coating on inorganic films and can increase the number of side retaining walls for resisting moisture in thin film device, and thus effectively improves the encapsulating in effect. The raised structures formed by multilayer stack can also be used to support metal masks to prevent the substrate surface pattern from being damaged during the coating process. Moreover, compared with the Frit packaging, the thin film packaging can effectively improve the mechanical strength of the whole display device.

A detailed description to the present invention will be provided as follows with Figures and Embodiments.

Embodiment 1

FIGS. 2 to 7 show flow charts of the processes of preparing the display module encapsulating structure in an embodiment of the present application. As shown in FIGS. 2 to 5, the application provides a method for preparing display module encapsulating structure, comprising the following steps:

Firstly, as shown in FIG. 1, perform an array process for the display devices on the basis of a substrate (such as Low Temperature Poly Silicon-LTPS substrate) to form the array substrate 21; the above array substrate 21 can be provided with a display area and a non-display area adjacent to the display area. The array substrate 21 of the display area is mainly used for the adhesion and the preparation of the display devices; moreover, a thin film transistor display circuit could be laid out on or in the array substrate 21 to drive the display module that would be prepared subsequently.

Additionally, during the array process, the raised features 23 are formed on the surface of the array substrate 21 in the non display area which is adjacent to the display area, said raised features 23 could be multilayer thin film stack structures; for example, the raised features 23 can be raised patterns prepared by exposure, development and etching during the foresaid array process, and then with a certain height; said raised features 23 could be column, strip column or other shapes.

Preferably, the material of the above raised features 23 could be the materials, of which the major components are carbon (C), nitrogen (N) and oxygen (O), such as heterocyclic polymers containing imino group and benzene ring; preferably, the material of said raised features 23 is Polyetherimide.

Figure 2:
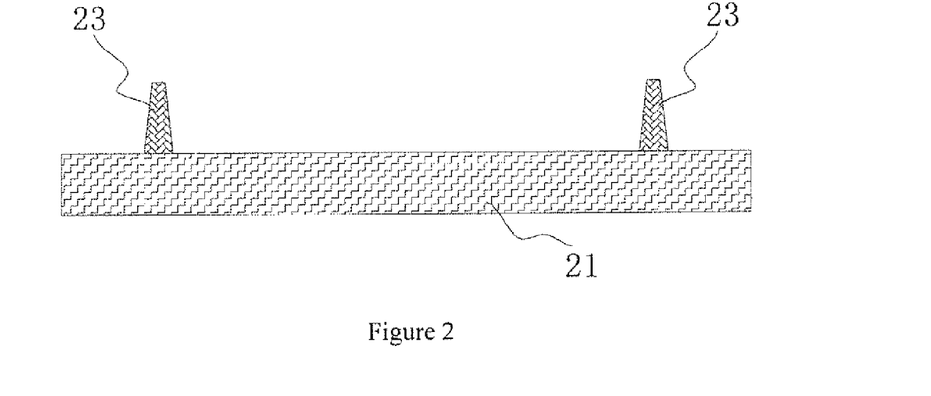
FIGS. 2 to 7 show flow charts of the processes of preparing the display module encapsulating structure in an embodiment of the present application.

Secondly, the display module 22 (such as OLED display module or other light emitting module) is attached in the display area of the above array substrate 21, connecting the foresaid thin film transistor display circuit, in the periphery of which the raised features 23 are placed, and could be used to display the first and second film layers that would be prepared subsequently so as to form the structure as shown in FIG. 2; there's a certain gap between the display 22 and the raised features 23 (not contact with each other), that is to say, the surface of the array substrate 21 between the display module 22 and the raised features 23 is exposed.

Figure 3:
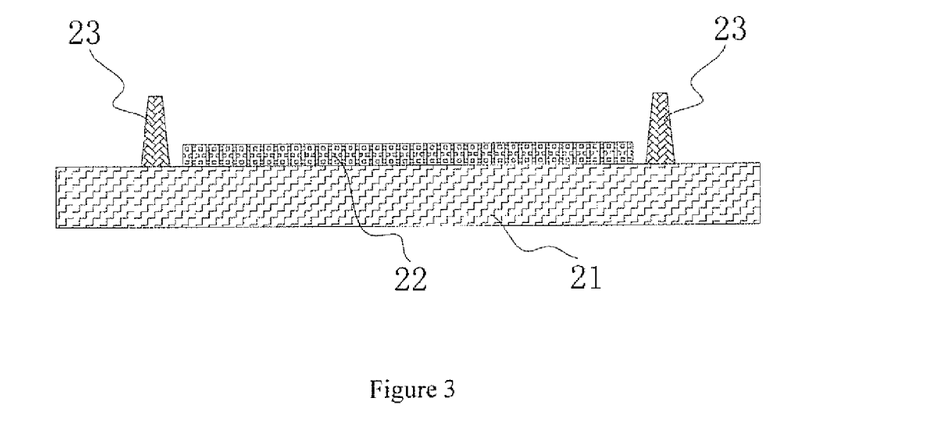
Figure 4:
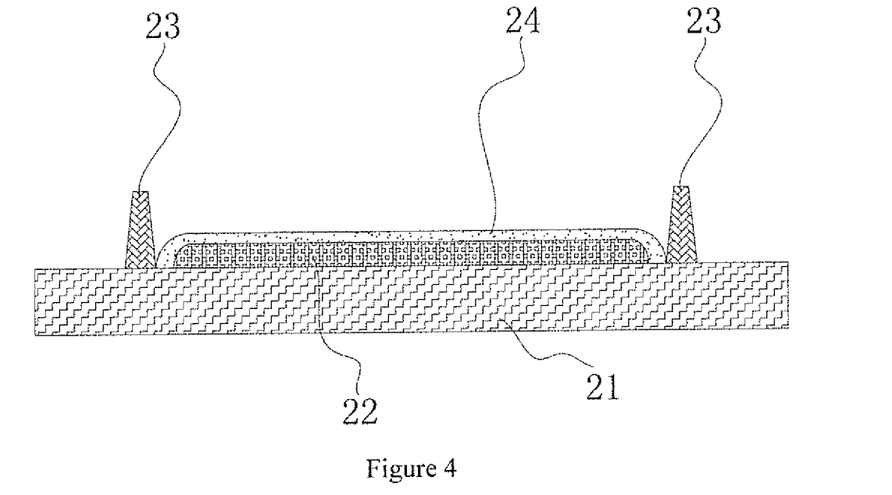

Preferably, the above display module 22 comprises a cathode, an anode and an organic light emitting layer arranged between the cathode and the anode, and simultaneously has a light emitting surface (the upper surface as shown in FIG. 3) for light emission and a backlight surface (the lower surface as shown in FIG. 3) opposite to the light emitting surface; said display module 22 is adhered to the array substrate 21 at its backlight surface.

Subsequently, employ the thin film encapsulating process to prepare the first film layer 24, the second film layer 25, the third film layer 26, the fourth film layer 27 and the fifth film layer 28; specifically:

Employ the atomic layer deposition (Atomic Layer Deposition, ALD) process to deposit inorganic materials such as AlOx, SiNx, TiO2, so as to form an inorganic thin film layer which is transparent, moisture-resistant, and oxygen-resistant, therefore, form the foresaid first film layer 24. The first film layer 24 covers the exposed surface of the display module 22 as well as the surface of the array substrate 21 exposed between the display module 22 and the raised features 23 (the first film layer 24 covers a region of the display module 22 defined by the raised features 23, and is not extended to the area of the display module 22 away from the raised features 23).

Preferably, alumina could be chose to prepare the inorganic thin film layer of 300~500 angstroms in thickness for the better sealing and transparent characteristics of the first film layer 24; meanwhile, the inorganic thin film layer can touch a small portion of the raised features 23 while covering the exposed surface of the array substrate 21.

Then, spray the organic materials such as acrylic resin compound through the process like ink jet printing (IJP) to form the organic thin film layer, that is the second film layer 25, over the first film layer 24; the second film layer 25 has the effect of encapsulating the defect particles to reduce the DP issue, eliminating stress to enhance the mechanical strength of the display device, improving the smoothness of the first film layer 24 (similar to the function of the flat layer) and so on; preferably, the thickness of the second film layer 25 could be selected in the range of 15000~20000 angstroms, to make the second film layer 25 has the foresaid effect of reducing DP issues, eliminating stress, improving smoothness and so on.

Figure 5:
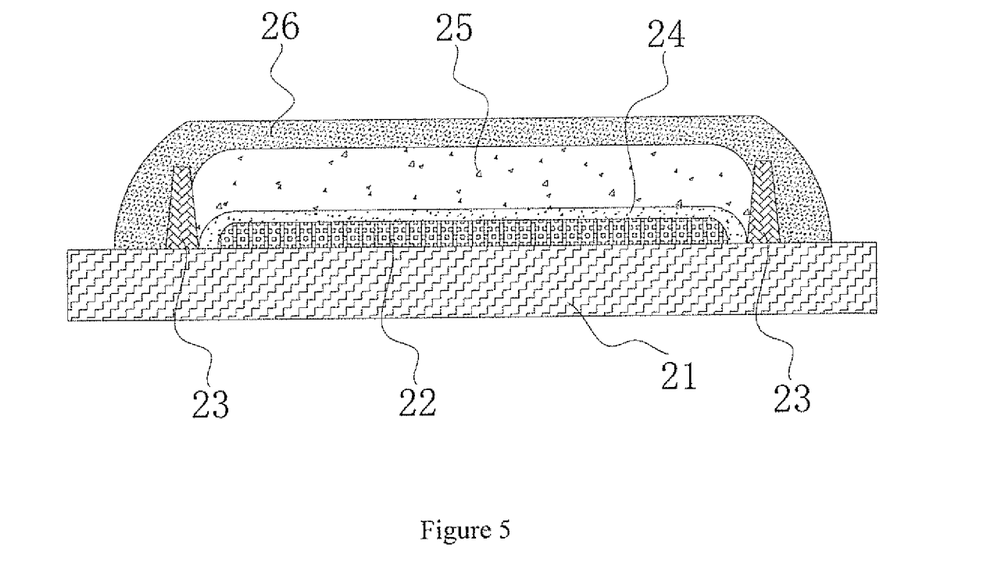

It should be noted that the second film layer 25 does not contact the array substrate 21, and could cover the surface, close to the display module, of the raised features 23, that is, the top surface of the raised features 23, the surface, away from the display module, of the raised features 23 and part of the surface, close to the display module, of the raised features 23 are all exposed; that is, the height (along the vertical direction of the light emitting surface of the display module, as shown in FIG. 5) is larger than the sum of the thickness of the first film layer 24 and the second film layer 25 (along the direction of the light emitting surface of the display module, as shown in FIG. 5).

Subsequently, deposit inorganic materials such as $SiN_x$, $AlO_x$, $SiO_x$ etc. through processes like chemical vapor deposition (CVD), atomic layer deposition (ALD), plasma enhanced chemical vapor deposition (PECVD) and so on to form a organic thin film layer that is the third film layer 26 which covers the surface of the second film layer 25 as well as the exposed surface of the raised features 23. The third film layer 26 packages the raised features 23 while covering the surface, outside of and close to the raised features 23, of the array substrate 21.

It should be noted that the third film layer 26 contacts the array substrate 21, and could cover not only the exposed surface of both the second film layer 25 and the raised features 23, but also part of the surface of the side where the raised features 23 is away from the display module 22 of the array substrate 21 (namely the non-display area). Therefore, the thin film encapsulation structure composing of the first film layer 24, the second film layer 25 and the third film layer 26 packages the foresaid raised features.

Preferably, for the good characteristics of resistance to moisture and oxygen and obtaining the proper film thickness, aluminium oxide could be selected to prepare inorganic thin film which is 5000~10000 angstroms in thickness, that is the third film layer 26. The third film layer 26 is over the above raised features 23 while covering the surface of both the second film layer 25 and the non-display area of array substrate 21.

Figure 6:
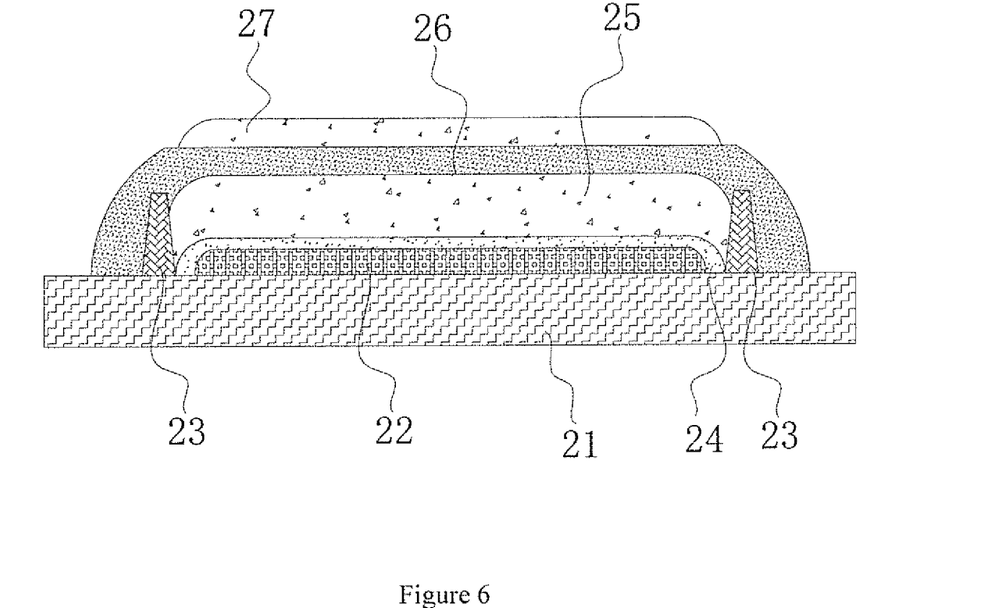

Subsequently, prepare the fourth film layer 27 onto the third film layer 26 through the same process used to preparing the second film layer 25, that is to spray the organic materials such as acrylic resin compound through the process like ink jet printing (IJP) to form the organic film layer, namely the fourth film layer 27, on the above third film layer. Said fourth film layer 27 also has the effect of encapsulating the defect particles to reduce the DP issue, eliminating stress to enhance the mechanical strength of the display device, improving the smoothness of the third film layer 26 (similar to the function of the flat layer) and so on, as shown in FIG. 6; preferably, the thickness of the fourth film layer 27 could be selected in the range of 15000~20000 angstroms, to make the third film layer 26 has the above effect of reducing DP issues, eliminating stress, improving smoothness and so on.

It should be noted that the fourth film layer 27 also does not contact with the array substrate 21, that is, the fourth film layer 27 only covers part of the surface of the third film layer 26, and exposes the surface, close to the array substrate 21, of the third film layer 26, in order that the fifth film layer 28 to be prepared later could seal the fourth film layer 27 onto the surface of the third film layer 26.

Figure 7:
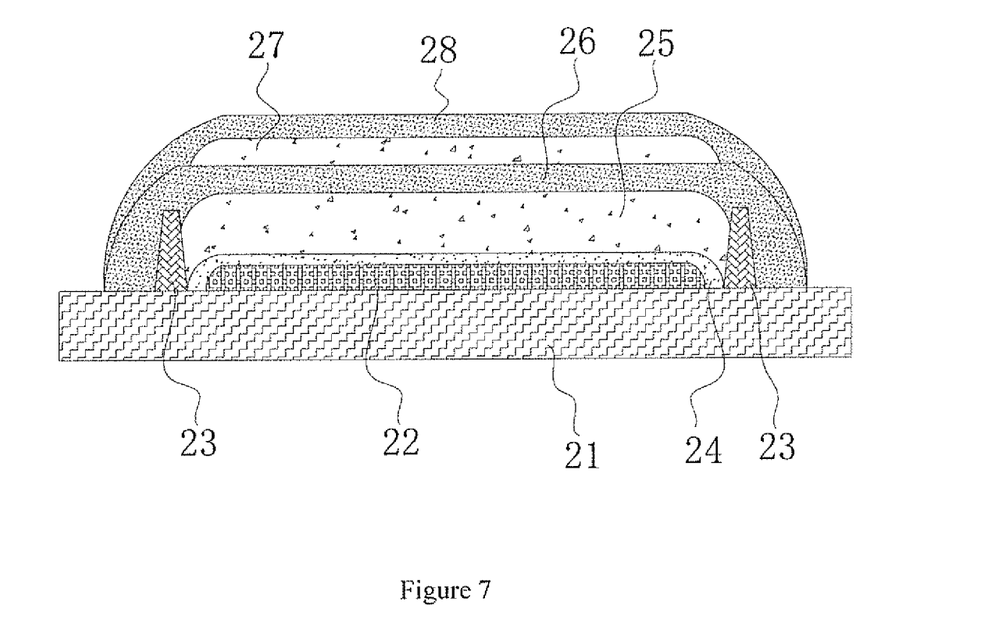

Lastly, as shown in FIG. 7, deposite inorganic materials such as SiNx, AlOx, SiOx etc. through processes like chemical vapor deposition (CVD), atomic layer deposition (ALD), plasma enhanced chemical vapor deposition (PECVD) and so on to form an inorganic thin film layer, that is, the fifth film layer 28 which covers the surface of the fourth film layer 27 as well as the exposed surface of the third film layer 26; and the fifth film layer 28 seals the fourth film layer 27 onto the surface of the third film layer 26.

It should be noted that the fifth film layer 28 could have or have no contact with the array substrate 21, and could cover not only the expose surface of both the third film layer 26 and the fourth film layer 27, but also part of the surface (non-display area), close to the third film layer 26, of the array substrate 21, therefore, the thin film encapsulation structure composing of the first film layer 24, the second film layer 25, the third film layer 26, the fourth film layer 27 and the fifth film layer 28 packages the foresaid raised features.

Preferably, for the good characteristics of resistance to moisture and oxygen and obtaining the proper film thickness, alumina could be chose to prepare inorganic thin film which is 5000~10000 angstroms in thickness, that is, the fifth film layer 28.

In this embodiment, after the preparation process of the above thin film encapsulation structure (namely the first film layer 24, the second film layer 25, the third film layer 26, the fourth film layer 27 and the fifth film layer 28) is done, the device structures that are used to form the cover glass of the display device could be pasted and fixed onto the foresaid thin film encapsulation structure which has already been formed, to complete the preparation process of the display device.

In this embodiment, due to the characteristics, good light transmittance performance and resistance to moisture and oxygen, of the foresaid inorganic films (the first film layer 24, the third film layer 26 and the fifth film layer 28), the display device could be effectively sealed and isolated without being damaged by moisture, oxygen and the other corrosive gases from the external environment; and the organic thin film placed between the inorganic film layers (the second film layer 25 and the fourth film layer 27) could effectively buffer the external and internal stresses; meanwhile, the raised features packaged by the thin film encapsulation structure could inhibit the diffusion of inorganic coating process while supporting the entire display device, therefore, the display module encapsulating structure and the display device, which are both prepared on the basis of the embodiment, have excellent sealing performance and a strong overall mechanical strength and flexibility.

Embodiment 2

On the basis of the above embodiment 1, as shown in FIG. 7, this embodiment provides a display module encapsulating structure, said display module encapsulating structure could be used to prepare various kinds of display devices (such as OLED display device), the above display module encapsulating structure comprises:

an array substrate 21, could be a substrate to which an array process has been performed, may include but not limited to LTPS substrate, etc.; said array substrate 21 has a front surface (namely the top surface, as shown in FIG. 5) and a bottom surface opposite to the top surface (namely the bottom surface, as shown in FIGS. 5 and 6); the material of the substrate can be glass. A rigid substrate or a flexible substrate could also be used to form the array substrate 21. The array substrate 21, in or on which device structures, such as a driving circuit, used for driving the display module to emit light, could be arranged.

Additionally, the array substrate 21 is configured with a display area used for arranging display device structure and a non-display area adjacent to the display area. On the front surface of the display area of the array substrate 21, a display module (such as OLED display module) 22, which has a light emitting surface (namely the top surface, as shown in FIG. 5) for light emission and a backlight surface (namely the bottom surface, as shown in FIG. 5) opposite to the light emitting surface, is provided. The backlight surface of the display module 22 is adhered onto the front surface of the array substrate.

Preferably, the foresaid OLED display module 22 can be an organic light emitting device (OLED) module or other kinds of light emitting modules, such as a cathode, an anode and a light emitting layer arranged between the cathode and the anode. The display module 22 connects to the foresaid driving circuit.

Meanwhile, multilayer thin film stack raised features 23 (such as the column raised features), which can be disposed in the periphery of the display module, are provided on the front surface of the above array substrate 22; additionally, said raised features 23 could be raised patterns with a certain height, prepared by exposure, development and etching during the foresaid array process. The material quality of the said raised features 23 could be the materials, of which the major components are carbon (C), nitrogen (N) and oxygen (O), with a certain degree of hardness, such as heterocyclic polymers containing imino group and benzene ring; preferably, the material of said raised features 23 could be Polyetherimide.

The first film layer 24, covers the exposed surface of both the display module 22 and the array substrate 21 between the display module 22 and the raised features 23, so that it can seal the display module 22. The first film layer 24, the material of which can be inorganic materials like $SiN_x$, $AlO_x$, $TiO_x$ etc., is transparent, well moisture-resistant, and well oxygen-resistant. For example, the first film layer 24 can be an aluminium oxide membrane which is 300~500 angstroms in thickness, and it should have contact with the surface of the array substrate 21 (accordingly, a gap is formed between the raised feature 23 and the display module 22, and the first film layer 24 is filled in and covered over the surface of the array substrate 21 exposed by the gap).

The second film layer 25, covers the first film layer as well as the surface of the raised features 23. Said second film layer 25 can be an organic thin films made of organic materials, such as acrylic resin compound, and it has the effect of wrapping the defect particles to reduce the DP issue, eliminating stress to enhance the mechanical strength of the display device, improving the smoothness of the first film layer 24 (similar to the function of a flat layer) and so on. However, the second film layer 25 (the thickness of it can be 15000~20000 angstroms) is blocked by the raised feature 23 and can not be in contact with the array substrate. The thickness of the raised feature 23 is larger than the sum of the thicknesses of the first film layer 24 and the second film layer 25.

The third film layer 26, covers exposed surface of both the second film layer 25 and the raised feature 23 and the surface, close to the raised feature 23 and away from one side of the display module 22, of the array module 21. Together with the first film layer 24 and the second film layer 25, the third film layer, which can be inorganic material like $SiN_x$, $AlO_x$, $SiO_x$, package the raised feature 23 onto the front surface of the array substrate.

Preferably, the third film layer can be SiN film which is 5000~10000 in thickness, for the excellent sealing property of the display device.

The fourth film layer 27, covering part of the surface of the third film layer 26, exposes the marginal area (namely the area, close to the array substrate 11, of the surface of the third film layer) of the third film layer 26.

The fifth film layer 28, covers the exposed surface of both the fourth film layer 27 and the third film layer 26, so that it can seal the fourth film layer 27 onto the surface of the third film layer 26.

Preferably, the characteristics of the foresaid fourth film layer 27, such as the material and the structure size, can be similar to or the same as those of the second film layer 25, that is, the fourth film layer can also be organic material like acrylic resin compound. The fourth film layer 27 has the effect of wrapping the defect particles to reduce the DP issue, eliminating stress to enhance the mechanical strength of the display device, improving the smoothness of the third film layer 26 (similar to the function of a flat layer) and so on. However, the fourth film layer 27 (the thickness can be 15000~20000 angstroms) doesn't have contact with the array substrate 21.

Similarly, the characteristics of the foresaid fifth film layer 28, such as the material quality and the structure size can be similar to or the same as those of the third film layer 26. For example, the fifth film layer 28 can be inorganic material like $SiN_x$, $AlO_x$, $SiO_x$. The fifth film layer 28 together with the first film layer 24, the second film layer 25, the third film layer 26 and the fourth film layer 27 packages the raised feature 23 onto the front surface of the array substrate 21. The fifth film layer 28 also can be SiN film which is 5000~10000 angstroms in thickness, for the excellent sealing property of the display device.

It should be noted that the structure provided in this embodiment could be prepared on the basis of the method provided in the above embodiment 1, so the technical features such as the preparation process, material of the film layer and the positional relationships between the film layers can be applied to the structures of embodiment 1, and thus are omitted here for brevity.

In conclusion, the display module encapsulating structure and preparation method thereof, provided in the embodiments of the present invention, encapsulates the display module directly onto the substrate by means of directly using the display module encapsulating structure formed through the thin film encapsulating process, meanwhile, the display module encapsulating structure has the properties of moisture-resistance, oxygen-resistance and buffering. Therefore, the display module encapsulating structure can effectively buffer internal and external stresses while ensuring the sealing effectiveness of the display module, and can avoid the films from falling off during the preparation of flexible devices, and can also effectively buffer the external impact forces caused by the falling and collision of the display device structures so that the issues like the split or the broken of screens, caused by the stress concentration generated by the external impact forces, are greatly reduced, therefore, the overall structural strength of the display device is enhanced, and both the yield and the performance of the display devices are effectively improved as well. Meanwhile, the raised features packaged by the thin film encapsulation structure could inhibit the diffusion of inorganic coating process while supporting the entire display device, therefore, the display module encapsulating structure and the display device, which are both prepared on the basis of the embodiments of the present invention, have excellent sealing performance and a strong overall mechanical strength and flexibility It will be obvious to those skilled in the art that various changes and modifications can be made without departing from the spirit and scope of the invention, and therefore all changes and modifications that fall within the scope of the claims intended to be embraced by the claims.

What is claimed is:

1. A display module encapsulated structure, comprising:
an array substrate, the surface of which is provided with a display module;
raised structures, disposed on a surface of the array substrate and placed in periphery of the display module;
a first film layer, covering the display module as well as a surface of the array substrate located between the display module and the raised structures to seal the display module;
a second film layer, covering the first film layer as well as parts of surfaces of the raised structures;
a third film layer, covering the second film layer, the raised structures and the parts of the surface of the array substrate;

a fourth film layer, covering parts of a surface of the third film layer; and a fifth film layer, covering parts of surfaces of the fourth film layer and third film layer to seal the fourth film layer onto the third film layer;

wherein, the raised structures are stack structures with multilayer films; and the raised structures are made of heterocyclic polymers containing imino group and benzene ring.

2. The display module encapsulating structure of claim 1, wherein the array substrate is further provided with a thin film transistor display circuit connected to the display module to drive the display module.

3. The display module encapsulating structure of claim 2, wherein the array substrate is a low temperature polysilicon substrate.

4. The display module encapsulating structure of claim 1, wherein the display module has a light emitting surface for light emission and a backlight surface opposite to the light emitting surface; and the backlight surface of the display module is adhered onto the surface of the array substrate; the first film layer covers the light emitting surface of the display module.

5. The display module encapsulating structure of claim 1, wherein, the display module is an OLED display module.

6. The display module encapsulating structure of claim 1, wherein, a thickness of the raised structures is larger than sum of thicknesses of the first film layer and second film layer.

7. The display module encapsulating structure of claim 1, wherein, the first film layer, the third film layer and the fifth film layer are all made of inorganic materials; and the second film layer and the fourth film layer are both made of organic materials.

8. The display module encapsulating structure of claim 7, wherein, the first film layer is made of metal oxide or silicon nitride, which are transparent, moisture-resistant, and oxygen-resistant.

9. The display module encapsulating structure of claim 7, wherein, the second film layer and the fourth film layer are made of acrylic resin compound having characteristics of buffering and transparency.

10. The display module encapsulating structure of claim 7, wherein, the third film layer and the fifth film layer are made of silicon nitride.

11. A method for preparing display module encapsulating structure, comprising:

forming an array substrate with a surface provided with a display module after a process for forming array; the array substrate in periphery of the display module being formed with raised structures;

preparing a first film layer to cover the display module as well as a surface of the array substrate located between the display module and the raised structures to seal the display module;

forming a second film layer onto an exposed surface of the first film layer; the second film layer covering parts of surfaces of the raised structures;

preparing a third film layer to cover parts of the second film layer, the raised structures and the array substrate;

preparing a fourth film layer onto the third film layer;

preparing the fifth film layer covering parts of surfaces of the fourth film layer and the third film layer to seal the fourth film layer onto the third film layer;

wherein, the raised structures are made of heterocyclic polymers containing imino group and benzene ring.

12. The method for preparing display module encapsulating structure of claim 11, further comprising:

preparing on the array substrate a thin film transistor display circuit connecting the display module to drive the display module.

13. The method for preparing display module encapsulating structure of claim 12, wherein, the array substrate is a low temperature polysilicon substrate.

14. The method for preparing display module encapsulating structure of claim 11, wherein, the display module has a light emitting surface for light emission and a backlight surface opposite to the light emitting surface; and the backlight surface of the display module is adhered onto the surface of the array substrate; the first film layer is formed onto the light emitting surface of the display module.

15. The method for preparing display module encapsulating structure of claim 11, wherein, the display module is an OLED display module.

16. The method for preparing display module encapsulating structure of claim 11, wherein, the raised structures are formed by stacking multilayer thin films.

17. The method for preparing display module encapsulating structure of claim 11, wherein, a thickness of the raised structures is larger than sum of thicknesses of the first film layer and second film layer.

18. The method for preparing display module encapsulating structure of claim 11, wherein forming the first film layer, the third film layer and the fifth film layer by inorganic materials; and forming the second film layer and the fourth film layer by organic materials.

19. The method for preparing display module encapsulating structure of claim 18, wherein, atomic layer deposition is employed to deposit metal oxide or silicon nitride, both of which are transparent, moisture-resistant, and oxygen-resistant, to prepare the first film layer.

20. The method for preparing display module encapsulating structure of claim 18, wherein, ink jet printing is employed to spray acrylic resin compound having characteristics of buffering and transparency, to prepare the second film layer and the fourth film layer.

21. The method for preparing display module encapsulating structure of claim 18, wherein, atomic layer deposition, chemical vapor deposition, or plasma enhanced chemical vapor deposition is employed to deposit silicon nitride to prepare the third film layer and the fifth film layer.

* * * * *